(12) United States Patent
Chang Chien et al.

(10) Patent No.: US 10,037,974 B2
(45) Date of Patent: Jul. 31, 2018

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Chien Lin Chang Chien, Kaohsiung (TW); Chang Chi Lee, Kaohsiung (TW); Chin-Li Kao, Kaohsiung (TW); Dao-Long Chen, Kaohsiung (TW); Ta-Chien Cheng, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 7 days.

(21) Appl. No.: 15/416,907

(22) Filed: Jan. 26, 2017

(65) Prior Publication Data

US 2017/0263589 A1   Sep. 14, 2017

Related U.S. Application Data

(60) Provisional application No. 62/305,034, filed on Mar. 8, 2016.

(51) Int. Cl.
| | |
|---|---|
| *H01L 25/065* | (2006.01) |
| *H01L 21/56* | (2006.01) |
| *H01L 21/78* | (2006.01) |
| *H01L 23/31* | (2006.01) |
| *H01L 23/367* | (2006.01) |

(Continued)

(52) U.S. Cl.
CPC ........ *H01L 25/0657* (2013.01); *H01L 21/565* (2013.01); *H01L 21/78* (2013.01); *H01L 23/3121* (2013.01); *H01L 23/3135* (2013.01); *H01L 23/3672* (2013.01); *H01L 24/33* (2013.01); *H01L 25/50* (2013.01);
(Continued)

(58) Field of Classification Search
CPC ............ H01L 23/49894; H01L 23/433; H01L 23/49811; H01L 23/49816; H01L 23/49833; H01L 23/42; H01L 25/105; H01L 23/3121; H01L 23/49827; H01L 23/5389; H01L 2224/32225; H01L 2224/48091; H01L 2224/4822
See application file for complete search history.

(56) References Cited

U.S. PATENT DOCUMENTS

| | | | |
|---|---|---|---|
| 8,803,332 B2 | 8/2014 | Lee et al. | |
| 2012/0193779 A1* | 8/2012 | Lee ..................... | H01L 23/3128 257/737 |

(Continued)

*Primary Examiner* — Michael Carter
*Assistant Examiner* — Mohammed R Alam
(74) *Attorney, Agent, or Firm* — Foley & Lardner LLP; Cliff Z. Liu

(57) ABSTRACT

A semiconductor device package includes a package substrate, a first electronic device, a second electronic device and a first molding layer. The package substrate includes a first surface, a second surface opposite to the first surface, and an edge. The first electronic device is positioned over and electrically connected to the package substrate through the first surface. The second electronic device is positioned over and electrically connected to the first electronic device. The first molding layer is positioned over the package substrate, and the first molding layer encapsulates a portion of the first surface and the edge of the package substrate.

19 Claims, 24 Drawing Sheets

(51) Int. Cl.
*H01L 23/00* (2006.01)
*H01L 25/00* (2006.01)

(52) U.S. Cl.
CPC ............... *H01L 2225/06541* (2013.01); *H01L 2225/06589* (2013.01)

(56) References Cited

U.S. PATENT DOCUMENTS

2015/0145140 A1* 5/2015 Haba .................... H01L 21/6835
257/774
2017/0047310 A1* 2/2017 Shim .................... H01L 25/0657

* cited by examiner

SEMICONDUCTOR DEVICE PACKAGE AND METHOD OF MANUFACTURING THE SAME

CROSS-REFERENCE TO RELATED APPLICATION

This application claims the benefit of and priority to U.S. Provisional Application No. 62/305,034 filed Mar. 8, 2016, the content of which is incorporated herein by reference in its entirety.

BACKGROUND

1. Technical Field

The present disclosure relates to a semiconductor device package and a method of manufacturing the same, and more particularly to a semiconductor device package including multiple electronic devices, such as stacked multiple electronic devices, and a method of manufacturing the same.

2. Description of the Related Art

A semiconductor device package with stacked electronic devices such as 2.5D or 3D semiconductor device package may be subject to warpage due to its asymmetrical structure and mismatch between physical characteristics of adjacent layers. In addition, some stacked semiconductor packages have an insufficient robustness.

SUMMARY

In some embodiments, according to one aspect, a semiconductor device package includes a package substrate, a first electronic device, a second electronic device and a first molding layer. The package substrate includes a first surface, a second surface opposite to the first surface, and an edge. The first electronic device is positioned over and electrically connected to the package substrate through the first surface. The second electronic device is positioned over and electrically connected to the first electronic device. The first molding layer is positioned over the package substrate, and the first molding layer encapsulates a portion of the first surface and the edge of the package substrate.

In some embodiments, a semiconductor device package includes a package substrate, a first electronic device, a second electronic device and a first molding layer. The package substrate includes a first surface and a second surface opposite to the first surface. The first electronic device is positioned over and electrically connected to the package substrate through the first surface. The second electronic device is positioned over and electrically connected to the first electronic device. The first molding layer is positioned over the package substrate, and the first molding layer encapsulates a portion of the first surface of the package substrate. A warpage of the semiconductor device package is less than 8 mils.

In some embodiments, according to another aspect, a method of manufacturing a semiconductor device package includes disposing a plurality of first electronic devices over a carrier, disposing a plurality of second electronic devices over the plurality of first electronic devices to form a plurality of stacked structures, wherein each of the stacked structures includes at least one of the first electronic devices and at least one of the second electronic devices, singulating the plurality of stacked structures; removing the stacked structures from the carrier, disposing the stacked structure over a package substrate, and forming a first molding layer over the package substrate to encapsulate the stacked structure.

BRIEF DESCRIPTION OF THE DRAWINGS

Aspects of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1A:
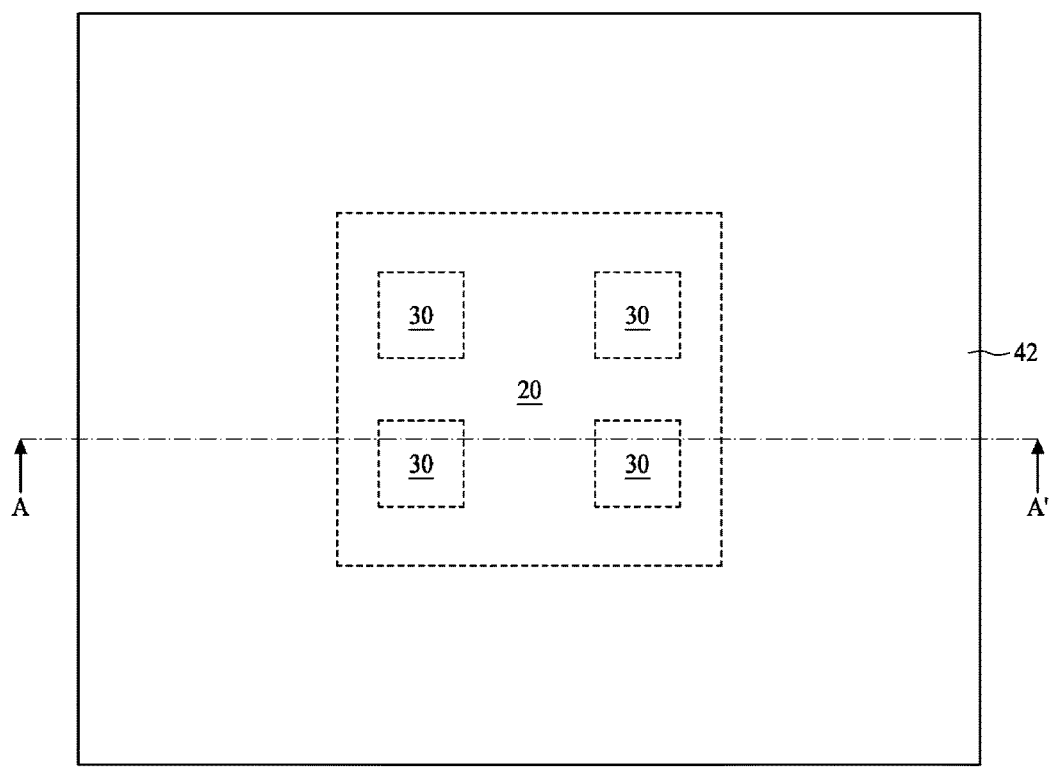
FIG. 1A is a top view of a semiconductor device package in accordance with some embodiments of the present disclosure.

The following disclosure provides embodiments, or examples, for implementing features of the provided subject matter. Specific examples of components and arrangements are described below to explain certain aspects of the present disclosure. These are, of course, merely examples and are not intended to be limiting. For example, reference to the formation of a first feature over or on a second feature in the description that follows may relate to embodiments in which the first and second features are formed in direct contact, and may also relate to embodiments in which additional features may be formed between the first and second features, such that the first and second features may not be in direct contact. In addition, the present disclosure may repeat reference numerals and/or letters in the various examples provided. This repetition is made for the purpose of simplicity and clarity and may indicate that components and/or devices referred to by repeated reference numerals and/or letters can be implemented using similar components and/or devices, and may have similar characteristics. However, the components and/or devices referred to by repeated reference numerals and/or letters need not be identical or need not be substantially similar in all embodiments.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

The following description is directed to a semiconductor device package. In some embodiments, the semiconductor device package includes a stacked structure disposed or positioned over, and electrically connected to, a package substrate, and a molding layer encapsulating an edge of the package substrate. This can help to enhance robustness of the semiconductor device package, The following description is further directed to a semiconductor device package less likely to exhibit warpage and/or having a tendency to exhibit less warpage than some other semiconductor device packages. The following description is also directed to a method of manufacturing a semiconductor device package, as discussed below.

Figure 1B:
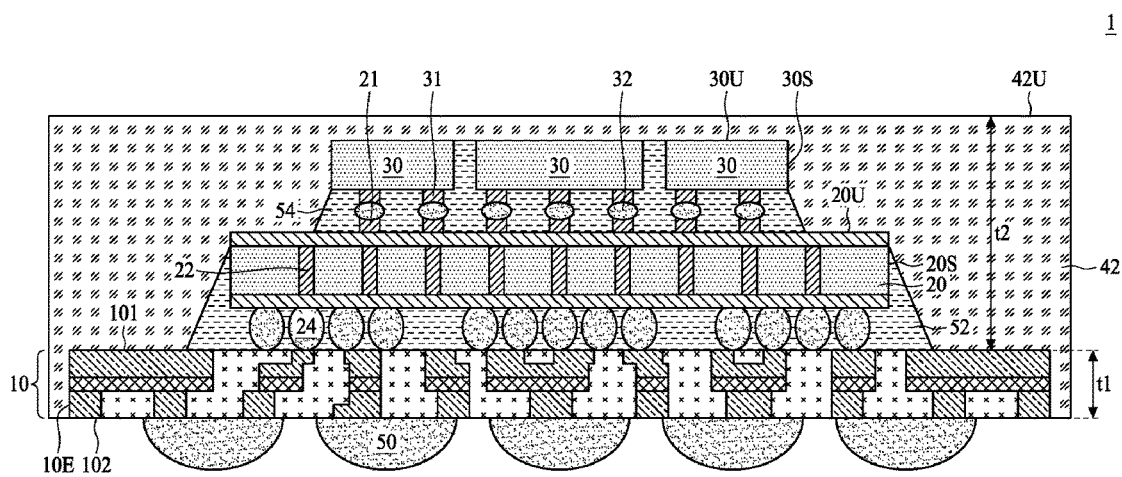
FIG. 1B is a cross-sectional view of the semiconductor device package along a line A-A' in accordance with some embodiments of the present disclosure.

FIG. 1A is a top view of a semiconductor device package 1 in accordance with some embodiments of the present disclosure, and FIG. 1B is a cross-sectional view of the semiconductor device package 1 along a line A-A' in accordance with some embodiments of the present disclosure. As shown in FIGS. 1A and 1B, the semiconductor device package 1 includes a package substrate 10, one or more first electronic devices 20, one or more second electronic device 20, and a first molding layer 42. The package substrate 10 includes a first surface 101, a second surface 102 opposite to the first surface 101, and an edge 10E. The edge 10E may be, for example, a surface or a portion of a surface and/or a sidewall or a portion of a sidewall. The first electronic device 20 is positioned over and electrically connected to the package substrate 10 through the first surface 101. The second electronic device 30 is positioned over and electrically connected to the first electronic device 20. The first molding layer 42 is positioned over the package substrate 10, and encapsulates a portion of the first surface 101 and at least a portion of the edge 10E of the package substrate 10.

In some embodiments, the package substrate 10 is a substrate including one or more layers of wirings and/or through vias formed therein, which provide an electric path between the first surface 101 and the second surface 102. In some embodiments, the package substrate 10 includes a circuit board such as a printed circuit board, a semiconductor substrate or the like.

In some embodiments, the first electronic device 20 may, but need not, include through vias 22 penetrating and/or traversing the first electronic device 20, and the second electronic device 30 is electrically connected to the package substrate 10 through the through vias 22 of the first electronic device 20. By way of example, the first electronic device 20 includes an interposer such as a silicon interposer with through silicon vias penetrating the interposer. In some embodiments, the semiconductor device package 1 further includes first conductive structures 24 positioned between and electrically connected to the package substrate 10 and the first electronic device 20. In some embodiments, the first conductive structures 24 may include conductive bumps such as solder bumps, solder balls, solder paste, or a combination thereof, or the like.

In some embodiments, the first electronic device 20 includes, but is not limited to, an active device such as an application specific IC (ASIC), a memory device such as a high bandwidth memory (HBM) device or another active device, and/or a passive device such as a capacitor, an inductor, a resistor or the like. In some embodiments, the semiconductor device package 1 further includes second conductive structures 32 positioned between and electrically connected to the first electronic device 20 and the second electronic device 30. In some embodiments, the second conductive structures 32 may include conductive bumps such as solder bumps, solder balls, solder paste, or a combination thereof, or the like. In some embodiments, the second conductive structures 32 are positioned between and electrically connected to first bonding pads 21 of the first electronic device 20 and second bonding pads 31 of the second electronic device 30.

A material of the first molding layer 42 includes, but is not limited to, a molding compound such as an epoxy resin or the like, and fillers such as silicon oxide fillers in the molding compound. The first molding layer 42 encapsulates the edge 10E of the package substrate 10, which can improve a robustness of the semiconductor device package 1 is enhanced. In some embodiments, the first molding layer 42 further encapsulates a portion of the first electronic device 20, and a portion of the second electronic device 30, which can help to protect the first electronic device 20 and the second electronic device 30. In some embodiments, the first molding layer 42 further encapsulates an upper surface 20U and a sidewall 20S of the first electronic device 20, and an upper surface 30U and a sidewall 30S of the second electronic device 30.

In some embodiments, the semiconductor device package 1 further includes a first underfill layer 52 such as a capillary underfill (CUF) positioned between the package substrate 10 and the first electronic device 20. In some embodiments, the semiconductor device package 1 further includes a second underfill layer 54 such as a capillary underfill between the first electronic device 20 and the second electronic device 30. In some embodiments, the semiconductor device package 1 further includes conductors 50 positioned under and electrically connected to the second surface 102 of the package substrate 10. In some embodiments, the conductors 50 include conductive bumps such as solder bumps, solder balls or other conductive structure. In some embodiments, the conductors 50 are electrically connected to the first electronic device 20 through the package substrate 10. In some embodiments, the conductors 50 are configured to allow the semiconductor device package 1 to be externally connected to an external electronic device.

The package substrate 10 has a first thickness t1 measured from the first surface 101 to the second surface 102. The first molding layer 42 has a second thickness t2 measured from the first surface 101 of the package substrate 10 to an upper surface 42U of the first molding layer 42. In some embodiments, a ratio of the second thickness t2 to the first thickness t1 is less than or equal to about 0.7, less than or equal to about 0.6, or less than or equal to about 0.5.

In some embodiments, a warpage of the semiconductor device package 1 is less than 8 mils, where 1 mil corresponds to 0.001 inches. In some embodiments, a coefficient of thermal expansion (CTE) of the first molding layer 42 is substantially in a range from about 5 ppm/° C. to about 50 ppm/° C. within a temperature range lower than its transition temperature (Tg). In some embodiments, the CTE of the first molding layer 42 is substantially in a range from about 10 ppm/° C. to about 45 ppm/° C., substantially in a range from about 15 ppm/° C. to about 40 ppm/° C., substantially in a range from about 20 ppm/° C. to about 35 ppm/° C., or substantially in a range from about 25 ppm/° C. to about 30 ppm/° C. within a temperature range lower than its transition temperature. In some embodiments, a Young's modulus of the first molding layer 42 is substantially in a range from about 12 GPa to about 24 GPa within a temperature range lower than its transition temperature, and is substantially in a range from about 0.3 GPa to about 0.6 GPa within a temperature range higher than its transition temperature.

Table 1 lists three different molding materials, having the listed Young's modulus (E), CTE ($\alpha$), transition temperature (Tg) and Poisson ratio (v), used as the material for the first molding layer in experiments.

TABLE 1

| Material type | E (GPa) | $\alpha$ (ppm/° C.) | Tg (° C.) | v |
|---|---|---|---|---|
| Molding material A | 24 < Tg < 0.3 | 10/40 | 131 | 0.30 |
| Molding material B | 12 < Tg < 0.45 | 21/73 | 160 | 0.30 |
| Molding material C | 12 < Tg < 0.6 | 30/81 | 160 | 0.30 |

Figure 2:
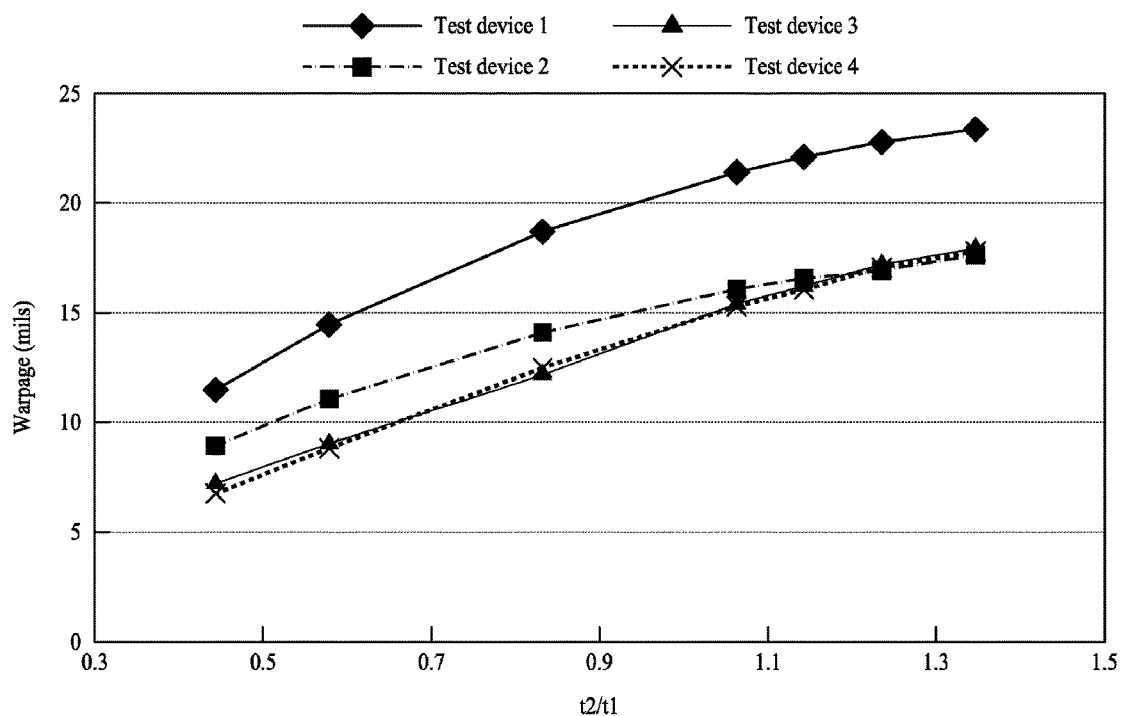
FIG. 2 illustrates a relation between warpage of the semiconductor device package and a ratio of a second thickness to a first thickness based on an experimental result, the experiment conducted at room temperature.

FIG. 2 illustrates a relation between warpage of a semiconductor device package 1 and a ratio of the second thickness to the first thickness (t2/t1) of the semiconductor device package 1 based on an experimental result, the experiment conducted at room temperature. Test device 1 uses molding material A as the first molding layer; Test device 2 uses molding material B as the first molding layer; Test device 3 uses molding material C as the first molding layer. Test devices 1, 2 and 3 each have a package size of about 55 mm*about 55 mm, and a first electronic device size of about 36.02 mm*about 27.97 mm. Test device 4 uses molding material C as the first molding layer. Test device 4 has a package size of about 47.5 mm*about 47.5 mm, and a first electronic device size of about 27.30 mm*about 31.35 mm. As shown in FIG. 2, the warpage of the semiconductor device package 1 reduces as t2/t1 decreases. The experimental result shows that the warpage of the semiconductor device package 1 can be alleviated by controlling t2/t1 to be, for example less than or equal to about 0.7.

The semiconductor device package 1 is compatible with wafer level chip scale package (WLCSP). The first molding layer 42 surrounds the edge 10E of the package substrate 10, and thus can provide sidewall protection for the semiconductor device package 1. The second thickness t2 of the first molding layer and the first thickness t1 of the package substrate 10 can be configured to alleviate the warpage of the semiconductor device package 1. In some embodiments, the physical characteristics such as CTE, Young's modulus and/or transition temperature of the first molding layer 42 are configured to further alleviate the warpage of the semiconductor device package 1.

Figure 3A:
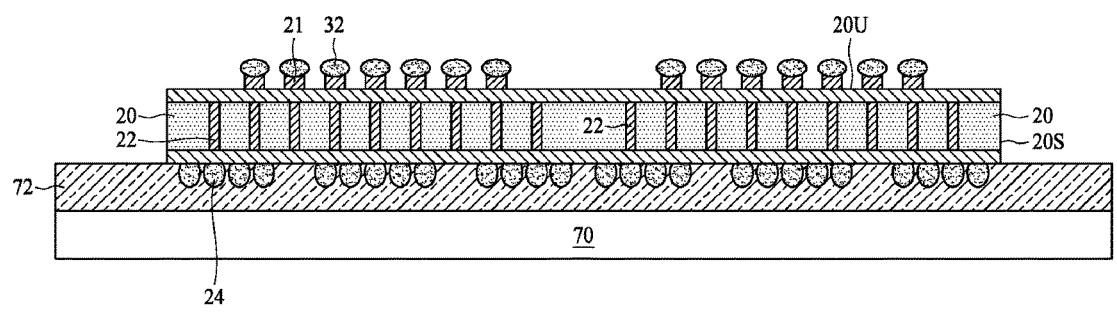
FIG. 3A, FIG. 3B, FIG. 3C, FIG. 3D, FIG. 3E and FIG. 3F illustrate an example of a manufacturing method of a semiconductor device package in accordance with some embodiments of the present disclosure.

FIG. 3A, FIG. 3B, FIG. 3C, FIG. 3D, FIG. 3E and FIG. 3F illustrate an example of a manufacturing method of the semiconductor device package 1 in accordance with some embodiments of the present disclosure. As depicted in FIG. 3A, first electronic devices 20 are disposed over a carrier 70. The carrier 70, such as a wafer, a glass substrate or the like is configured as a temporary carrier to handle the first electronic devices 20. In some embodiments, electronic devices 20 are disposed over the carrier 70 with an adhesive layer 72. In some embodiments, the adhesive layer 72 includes a tape or other suitable adhesive material. In some embodiments, first conductive structures 24 are formed under the first electronic devices 20, and electrically connected to the through vias 22. In some embodiments, the first conductive structures 24 are enclosed and supported by the adhesive layer 72. In some embodiments, first bonding pads 21 are formed over the first electronic devices 20, and electrically connected to through vias 22. In some embodiments, the second conductive structures 32 are formed over the first bonding pads 21.

Figure 3B:
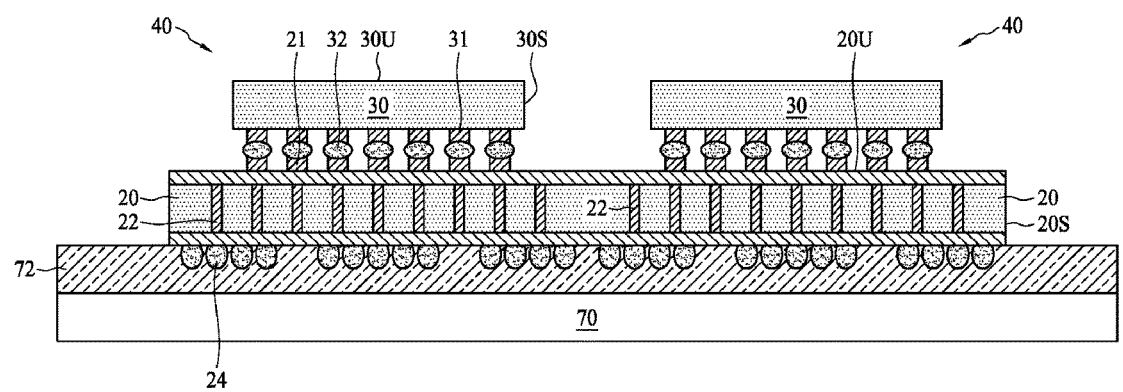

As depicted in FIG. 3B, second electronic devices 30 are disposed over the first electronic devices 20 to form stacked structures 40. Each of the stacked structures 40 includes at least one of the first electronic devices 20 and at least one of the second electronic devices 30. In some embodiments, second bonding pads 31 are connected to the first bonding pads 21 through second conductive structures 32 such that one or more second electronic devices 30 are electrically connected to the respective first electronic device 20. In some embodiments, the second conductive structures 32 include solder bumps or the like, and a reflow process is performed on the second conductive structures 32. In some embodiments, a clean process is performed to clean flux.

Figure 3C:
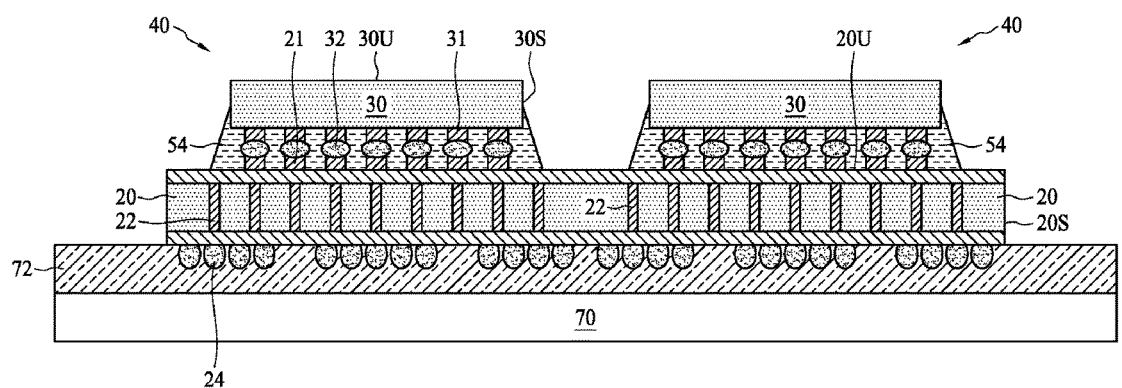
Figure 3D:
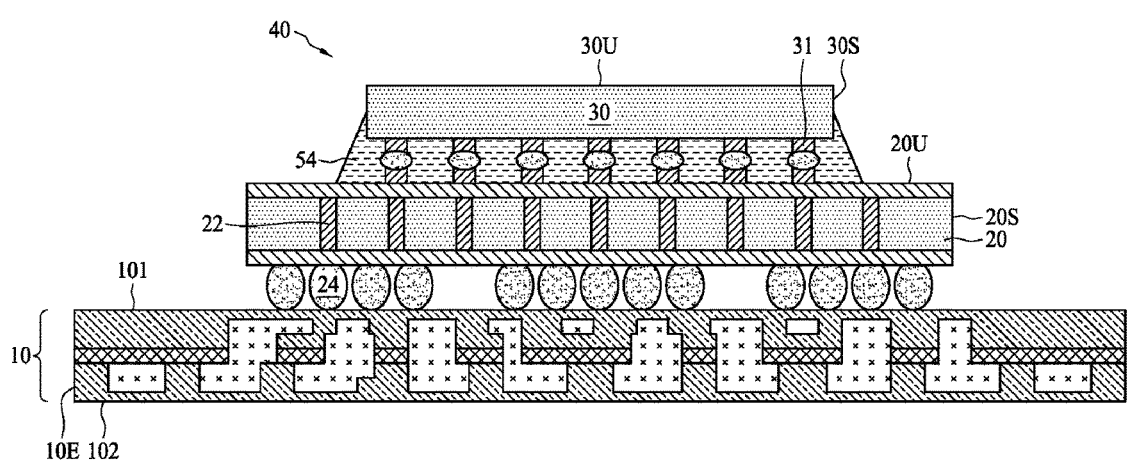

As depicted in FIG. 3C, second underfill layers 54 are formed between the first electronic devices 20 and the second electronic devices 30. In some embodiments, the second underfill layers 54 are dispensed between the first electronic devices 20 and the second electronic devices 30 and then thermally cured. As depicted in FIG. 3D, the stacked structures 40 are singulated, and removed from the carrier 70. The singulated stacked structure 40 including at least one first electronic device 20 and at least one second electronic device 30 is then disposed over a package substrate 10. In some embodiments, the stacked structure 40 and the package substrate 10 are connected through the first conductive structures 24. In some embodiments, the first conductive structures 24 include solder bumps or the like, and a reflow process is performed on the first conductive structures 24. In some embodiments, a clean process is performed to clean flux.

Figure 3E:
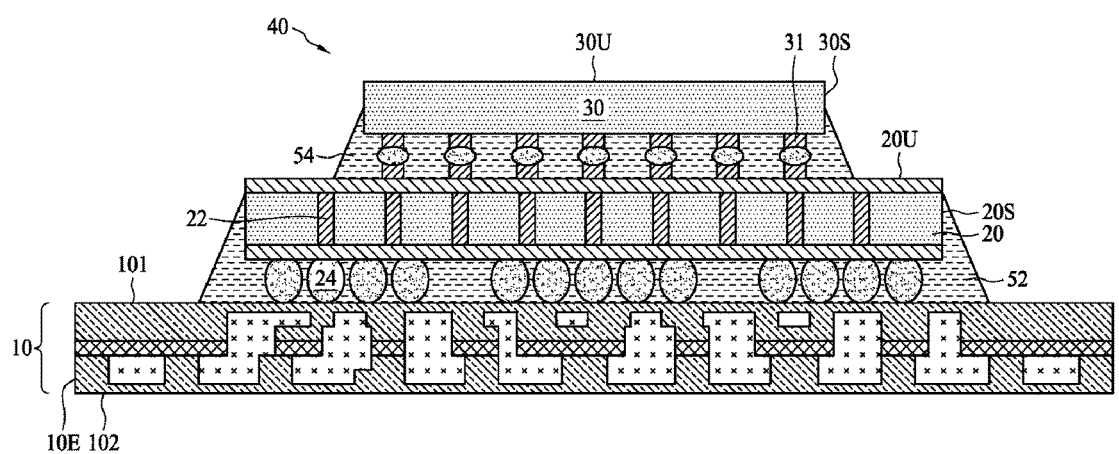
Figure 3F:
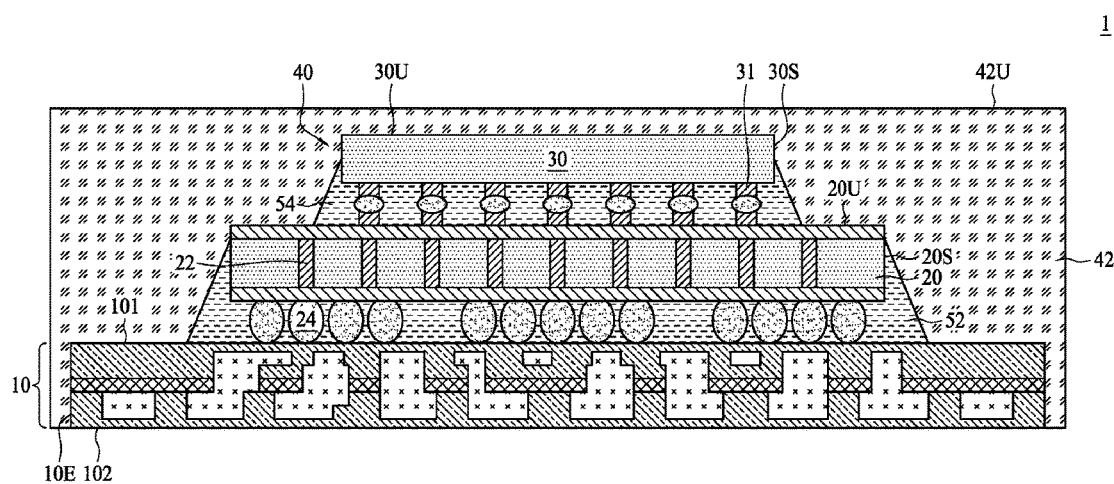

As depicted in FIG. 3E, a first underfill layer 52 is formed between the package substrate 10 and the first electronic device 20. In some embodiments, the first underfill layer 52 is dispensed between the package substrate 10 and the first electronic device 20, and then thermally cured. As depicted in FIG. 3F, a first molding layer 42 is formed over the package substrate 10, and encapsulates a portion of a first surface 101 and an edge 10E of the package substrate 10. In some embodiments, the first molding layer 42 further encapsulates a portion of the first electronic device 20, and a portion of the second electronic device 30, and protects the first electronic device 20 and the second electronic device 30. In some embodiments, conductors 50 are formed over the second surface 102 of the package substrate 10 to complete the semiconductor device package 1.

The semiconductor device package and manufacturing method of the present disclosure are not limited to the above-mentioned embodiments, and may be implemented according to other embodiments. To streamline the following description and for convenience of comparison between various embodiments of the present disclosure, components in each of the following embodiments that are similar to components described above are marked with same numerals as used above, and description of those components may be omitted.

Figure 4:
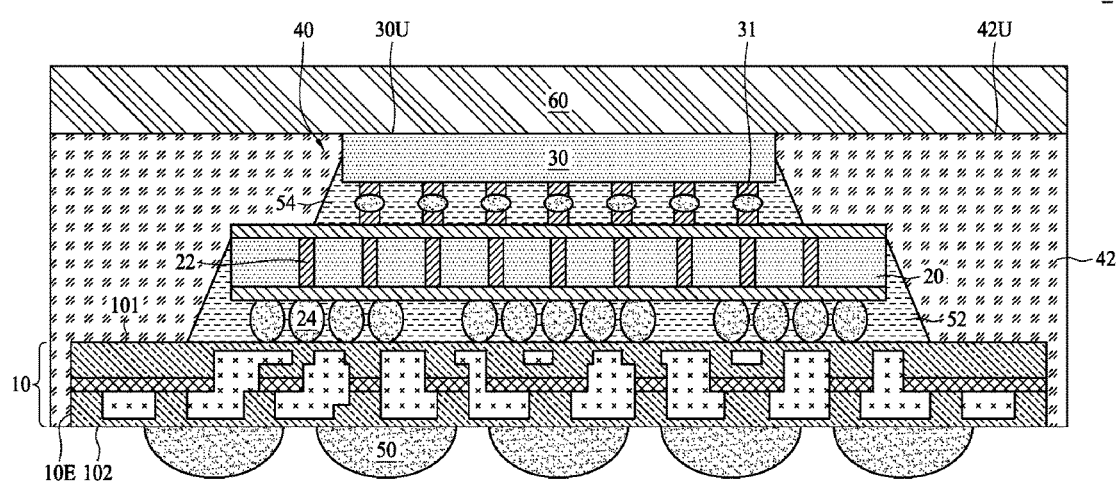
FIG. 4 is a cross-sectional view of a semiconductor device package in accordance with some embodiments of the present disclosure.

FIG. 4 is a cross-sectional view of a semiconductor device package 2 in accordance with some embodiments of the present disclosure. As shown in FIG. 4, differently than is the case for some embodiments of the semiconductor device package 1, the first molding layer 42 is thinned by, for example, grinding to expose the upper surface 30U of the second electronic device 30. In some embodiments, the semiconductor device package 2 further includes a heat spreader 60 with good thermal conductivity positioned over the upper surface 30U of the second electronic device 30. In some embodiments, the heater spreader 60 is in contact with the exposed second electronic device 30 to enhance heat dissipation. In some embodiments, the heater spreader 60 is adhered to the exposed second electronic device 30 with adhesive.

Figure 5:
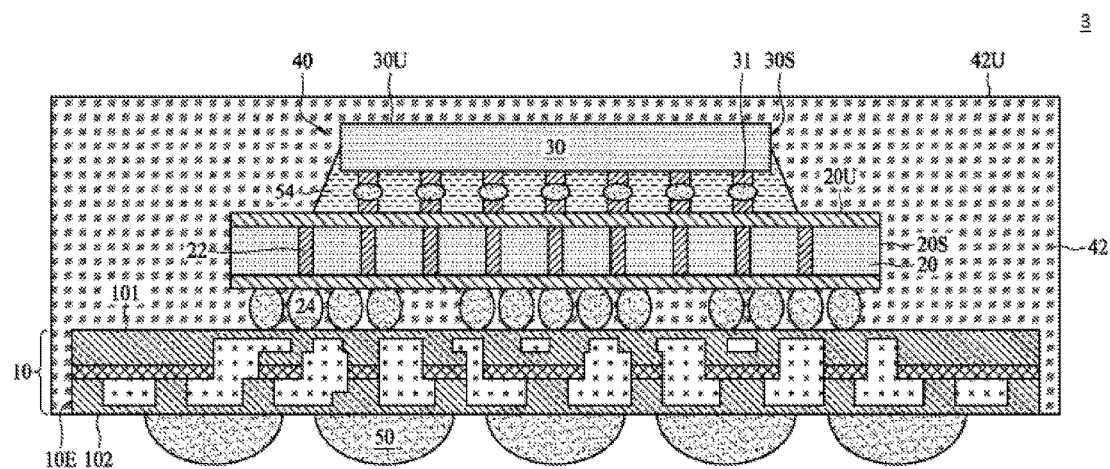
FIG. 5 is a cross-sectional view of a semiconductor device package in accordance with some embodiments of the present disclosure.

FIG. 5 is a cross-sectional view of a semiconductor device package 3 in accordance with some embodiments of the present disclosure. As shown in FIG. 5, differently than is the case for some embodiments of the semiconductor device package 1, the first underfill layer 52 is omitted. The first molding layer 42 of the semiconductor device package 3 is further located between the package substrate 10 and the first electronic device 20, and configured as a molding underfill (MUF). In some embodiments, the first molding layer 42 may expose the upper surface 30U of the second electronic device 30. In some embodiments, a heat spreader (not shown) may be formed over the upper surface 30U of the second electronic device 30 to enhance heat dissipation ability.

Figure 6:
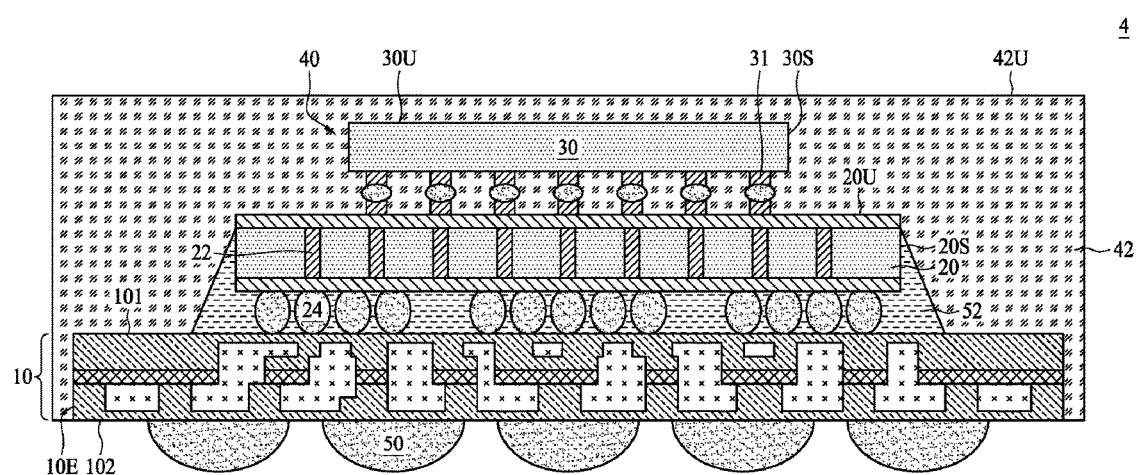
FIG. 6 is a cross-sectional view of a semiconductor device package in accordance with some embodiments of the present disclosure.

FIG. 6 is a cross-sectional view of a semiconductor device package 4 in accordance with some embodiments of the present disclosure. As shown in FIG. 6, differently than is the case for some embodiments of the semiconductor device package 1, the second underfill layer 54 is omitted. The first molding layer 42 of the semiconductor device package 4 is further located between the first electronic device 20 and the second electronic device 30, and configured as a molding underfill (MUF). In some embodiments, the first molding layer 42 may expose the upper surface 30U of the second electronic device 30. In some embodiments, a heat spreader (not shown) may be formed over the upper surface 30U of the second electronic device 30 to enhance heat dissipation ability.

Figure 7:
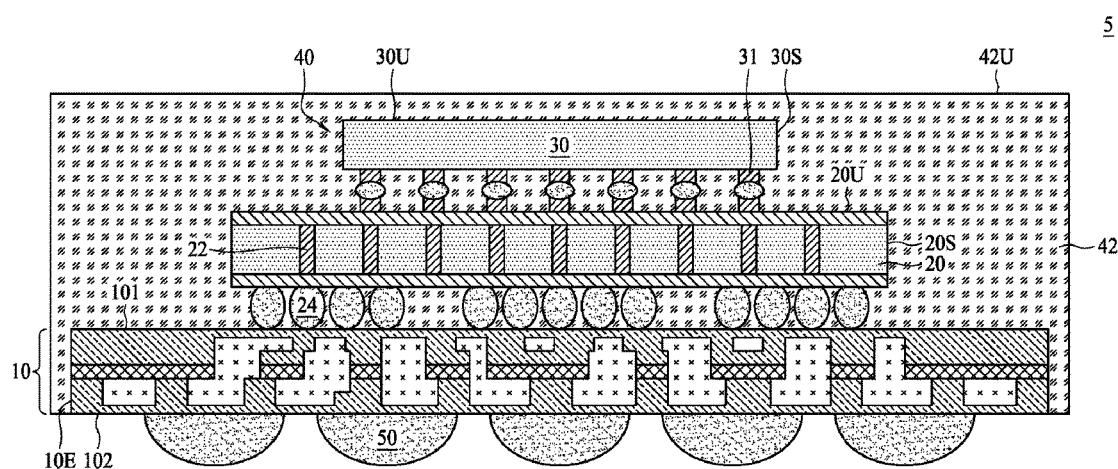
FIG. 7 is a cross-sectional view of a semiconductor device package in accordance with some embodiments of the present disclosure.

FIG. 7 is a cross-sectional view of a semiconductor device package 5 in accordance with some embodiments of the present disclosure. As shown in FIG. 7, differently than is the case for some embodiments of the semiconductor device package 1, the first underfill layer 52 and the second underfill layer 54 are omitted. The first molding layer 42 of the semiconductor device package 5 is further located between the package substrate 10 and the first electronic device 20 and between the first electronic device 20 and the second electronic device 30, and configured as molding underfill (MUF). In some embodiments, the first molding layer 42 may expose the upper surface 30U of the second electronic device 30. In some embodiments, a heat spreader (not shown) may be formed over the upper surface 30U of the second electronic device 30 to enhance heat dissipation ability.

Figure 8:
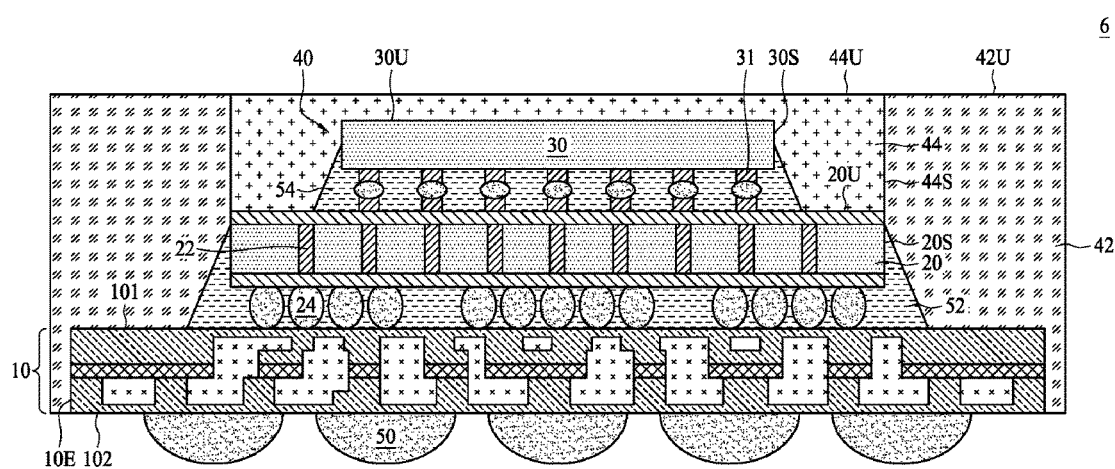
FIG. 8 is a cross-sectional view of a semiconductor device package in accordance with some embodiments of the present disclosure.

FIG. 8 is a cross-sectional view of a semiconductor device package 6 in accordance with some embodiments of the present disclosure. As shown in FIG. 8, differently than is the case for some embodiments of the semiconductor device package 1, the semiconductor device package 6 further includes a second molding layer 44 positioned over the first electronic device 20. In some embodiments, the second molding layer 44 encapsulates a portion of the upper surface 20U of the first electronic device 20 and a portion of the upper surface 30U and the sidewall 30S of the second electronic device 30. A material of the second molding layer 44 includes, but is not limited to, a molding compound such as an epoxy resin or the like, and fillers such as silicon oxide fillers in the molding compound. In some embodiments, a sidewall 44S of the second molding layer 44 is surrounded by the first molding layer 42. In some embodiments, an upper surface 44U of the second molding layer 44 is substantially coplanar with the upper surface 42U of the first molding layer 42. In some embodiments, the first molding layer 42 and the second molding layer 44 include a same material.

In some embodiments, a warpage of the semiconductor device package 6 is less than 8 mils. In some embodiments, the CTE of the first molding layer 42 and the second molding layer 44 are substantially in a range from about 5 ppm/° C. to about 50 ppm/° C. within a temperature range lower than its transition temperature (Tg). In some embodiments, the CTE of the first molding layer 42 and the second molding layer 44 are substantially in a range from about 10 ppm/° C. to about 45 ppm/° C., substantially in a range from about 15 ppm/° C. to about 40 ppm/° C., substantially in a range from about 20 ppm/° C. to about 35 ppm/° C., or substantially in a range from about 25 ppm/° C. to about 30 ppm/° C. within a temperature range lower than its transition temperature. In some embodiments, the Young's modulus of the first molding layer 42 and the second molding layer 44 are substantially in a range from 12 about GPa to about 24 GPa within a temperature range lower than its transition temperature, and are substantially in a range from about 0.3 GPa to about 0.6 GPa within a temperature range higher than its transition temperature.

Figure 9:
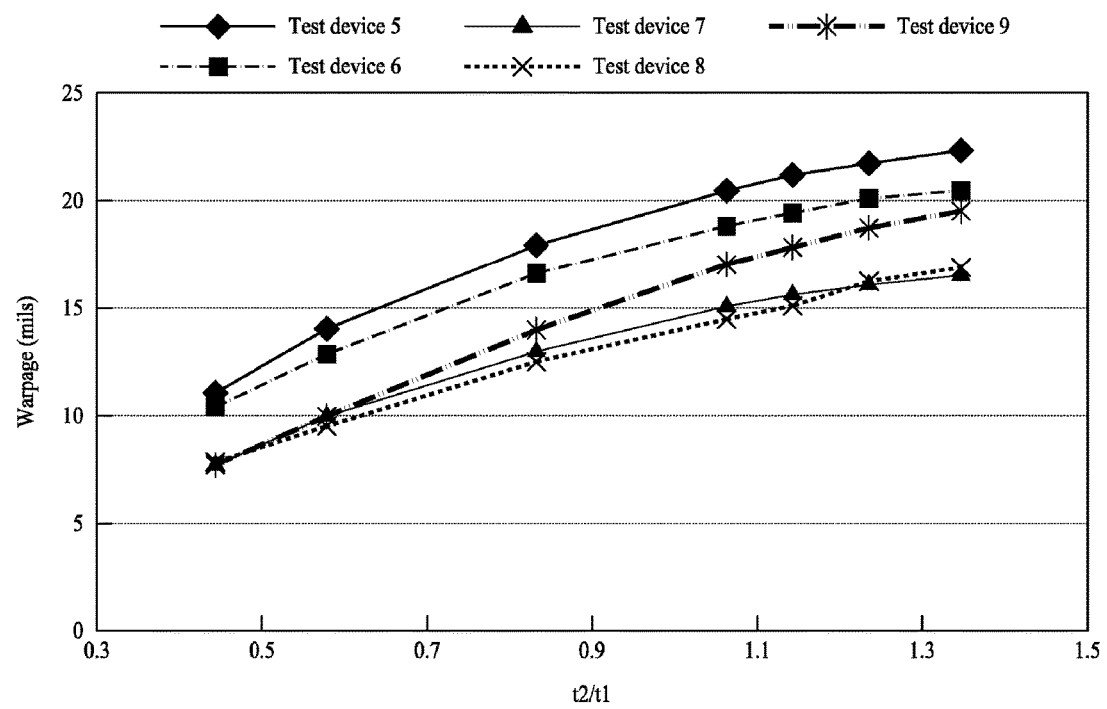
FIG. 9 illustrates a relation between warpage of the semiconductor device package and a ratio of a second thickness to a first thickness based on an experimental result, the experiment conducted at room temperature.

FIG. 9 illustrates a relation between warpage of a semiconductor device package 6 and a ratio of the second thickness to the first thickness (t2/t1) of the semiconductor device package 6 based on an experimental result, the experiment conducted at room temperature. Test device 5 uses molding material A as the first molding layer and molding material B as the second molding layer; Test device 6 uses molding material A as the first molding layer and molding material C as the second molding layer; Test device 7 uses molding material C as the first molding layer and molding material A as the second molding layer; Test device 8 uses molding material C as the first molding layer and molding material B as the second molding layer. Test devices 5, 6, 7 and 8 each have a package size of about 55 mm*about 55 mm, and a first electronic device size of about 36.02 mm*about 27.97 mm. Test device 9 uses molding material C as the first molding layer and molding material A as the second molding layer. Test device 9 has a package size of about 47.5 mm*about 47.5 mm, and a first electronic device size of about 27.30 mm*about 31.35 mm. As shown in FIG. 9, the warpage of the semiconductor device package 6 reduces as t2/t1 decreases. The experimental result shows that the warpage of the semiconductor device package 6 can be alleviated by controlling t2/t1 to be, for example, less than or equal to about 0.7.

The semiconductor device package 6 is compatible with wafer level chip scale package (WLCSP). The first molding layer 42 surrounds the edge 10E of the package substrate 10, and thus can provide sidewall protection for the semiconductor device package 6. The second thickness t2 of the first molding layer and the first thickness t1 of the package substrate 10 are configured to alleviate the warpage of the semiconductor device package 6. In some embodiments, the physical characteristics such as CTE, Young's modulus and/or transition temperature of the first molding layer 42 and the second molding layer 44 are configured to alleviate the warpage of the semiconductor device package 6.

Figure 10A:
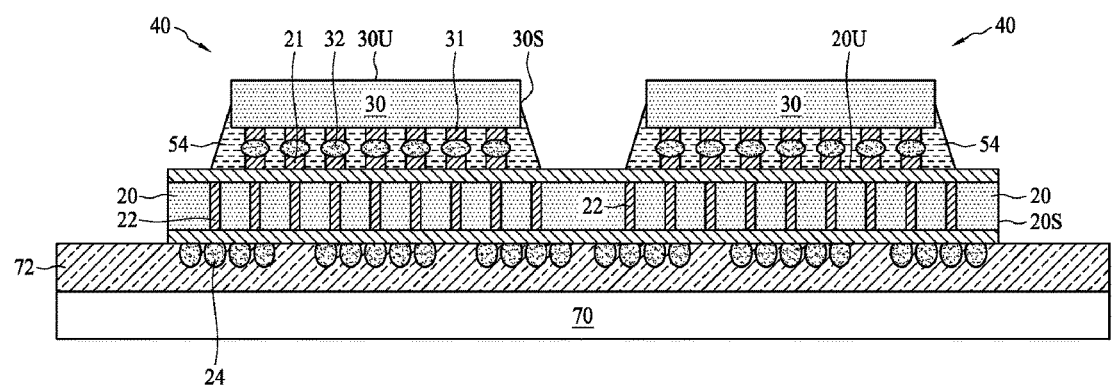
FIG. 10A, FIG. 10B, FIG. 10C, FIG. 10D and FIG. 10E illustrate an example of a manufacturing method of a semiconductor device package in accordance with some embodiments of the present disclosure.

FIG. 10A, FIG. 10B, FIG. 10C, FIG. 10D and FIG. 10E illustrate an example of a manufacturing method of the semiconductor device package 6 in accordance with some embodiments of the present disclosure. As depicted in FIG. 10A, first electronic devices 20 are disposed over a carrier 70. Then, second electronic devices 30 are disposed over the first electronic devices 20 to form stacked structures 40. In some embodiments, second underfill layers 54 are formed between the first electronic devices 20 and the second electronic devices 30.

Figure 10B:
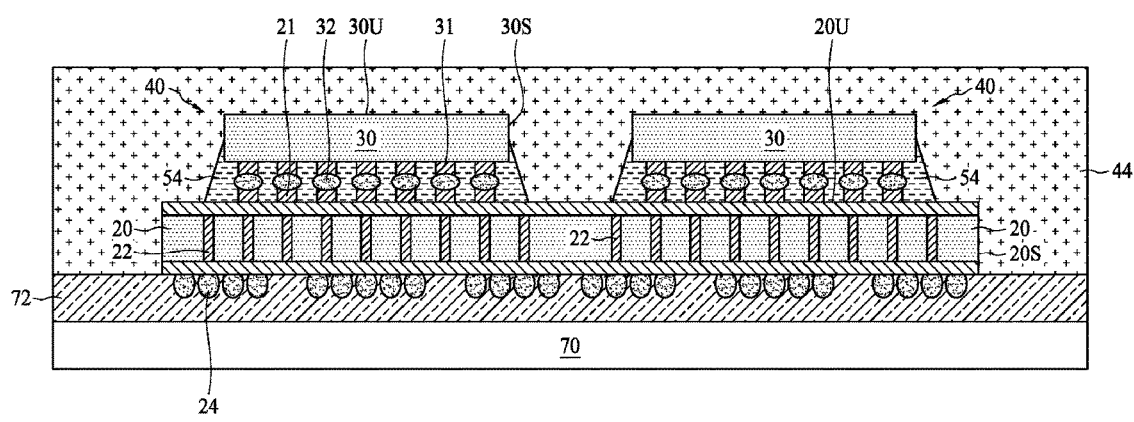
Figure 10C:
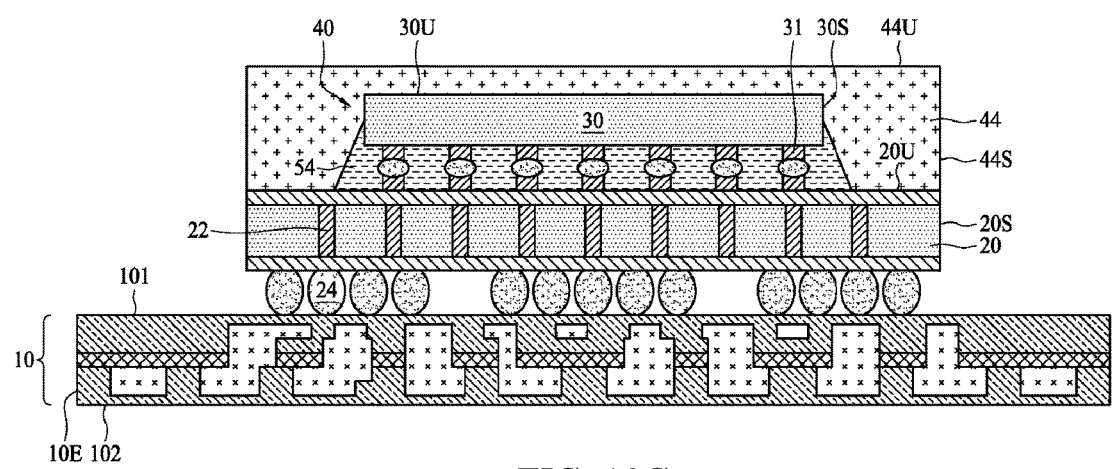
Figure 10D:
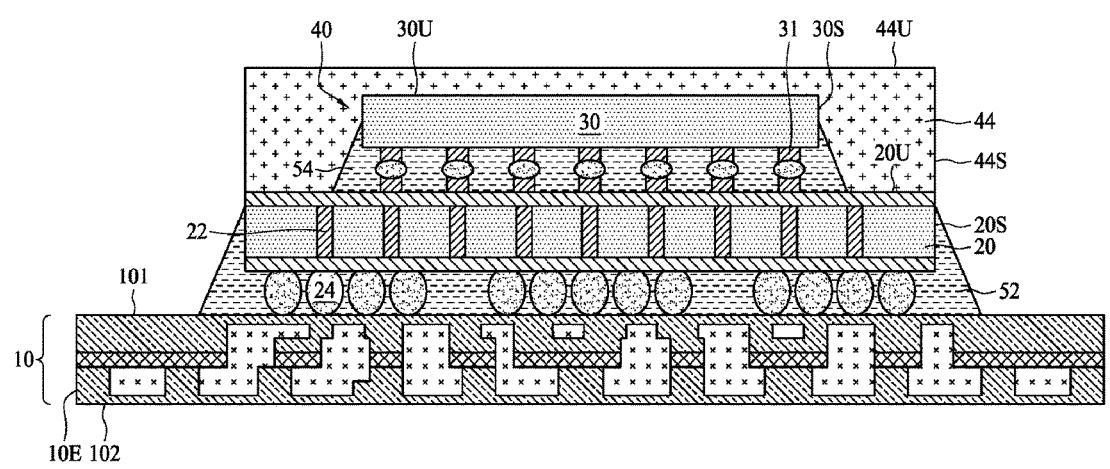

As depicted in FIG. 10B, a second molding layer 44 is formed over the stacked structures 40 before singulating the stacked structures 40. In some embodiments, the second molding layer 44 encapsulates a portion of an upper surface 20U of at least one of the first electronic devices 20 and a portion of an upper surface 30U and a sidewall 30S of at least one of the second electronic devices 30. As depicted in FIG. 10C, the stacked structures 40 are singulated, and removed from the carrier 70. The singulated stacked structure 40 including at least one first electronic device 20 and at least one second electronic device 30 is then disposed over a package substrate 10. As depicted in FIG. 10D, a first underfill layer 52 is formed between the package substrate 10 and the first electronic device 20.

Figure 10E:
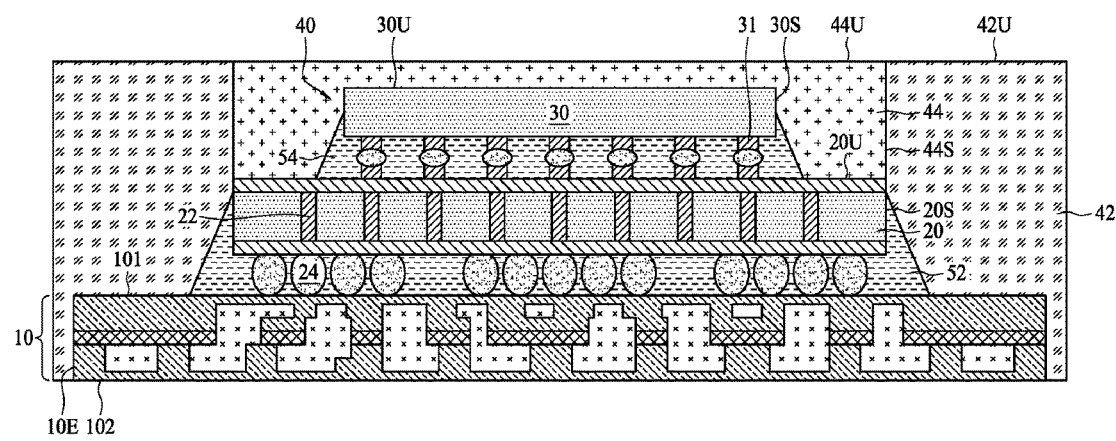

As depicted in FIG. 10E, a first molding layer 42 is formed over the package substrate 10, and encapsulates a portion of a first surface 101 and an edge 10E of the package substrate 10. In some embodiments, the first molding layer 42 surrounds a sidewall 44S of the second molding layer 44. In some embodiments, an upper surface 44U of the second molding layer 44 is substantially coplanar with an upper surface 42U of the first molding layer 42. In some embodiments, conductors 50 are formed over the second surface 102 of the package substrate 10 to complete the semiconductor device package 6 as shown in FIG. 8.

Figure 11:
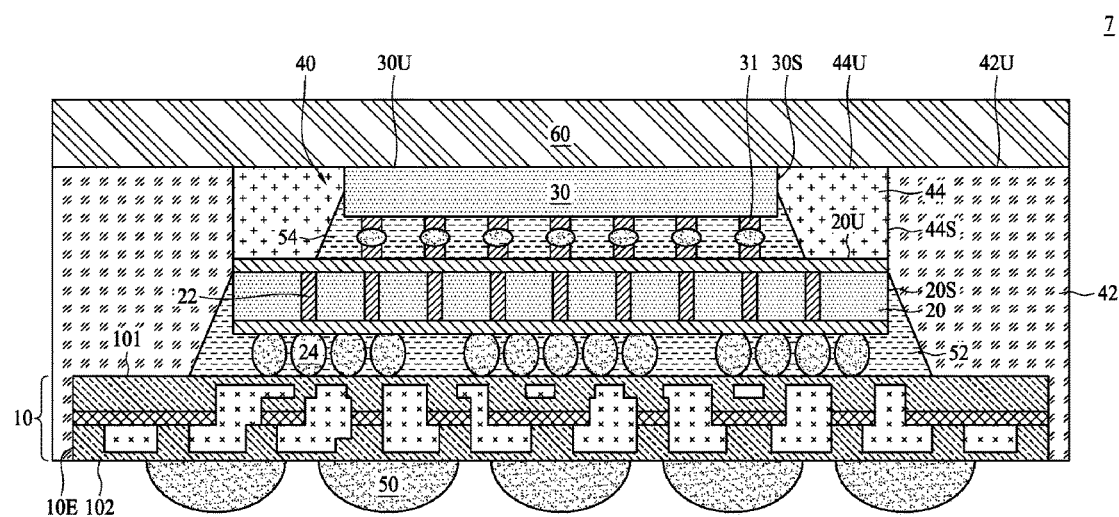
FIG. 11 is a cross-sectional view of a semiconductor device package in accordance with some embodiments of the present disclosure.

FIG. 11 is a cross-sectional view of a semiconductor device package 7 in accordance with some embodiments of the present disclosure. As shown in FIG. 11, differently than is the case for some embodiments of the semiconductor device package 6, the second molding layer 44 is thinned by, for example, grinding to expose the upper surface 30U of the second electronic device 30. In some embodiments, the semiconductor device package 7 further includes a heat spreader 60 with good thermal conductivity positioned over the upper surface 30U of the second electronic device 30. In some embodiments, the heater spreader 60 is in contact with the exposed second electronic device 30 to enhance heat dissipation ability. In some embodiments, the heater spreader 60 is adhered to the exposed second electronic device 30 with adhesive.

Figure 12:
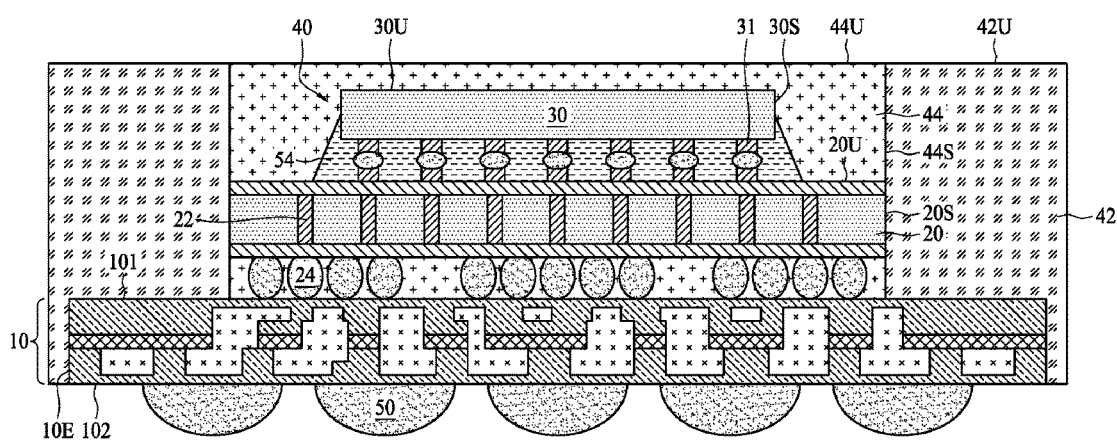
FIG. 12 is a cross-sectional view of a semiconductor device package in accordance with some embodiments of the present disclosure.

FIG. 12 is a cross-sectional view of a semiconductor device package 8 in accordance with some embodiments of the present disclosure. As shown in FIG. 12, differently than is the case for some embodiments of the semiconductor device package 6, the first underfill layer 52 is omitted. The second molding layer 44 of the semiconductor device package 8 is further located between the package substrate 10 and the first electronic device 20, and configured as a molding underfill (MUF). In some embodiments, the second molding layer 44 may expose the upper surface 30U of the second electronic device 30. In some embodiments, a heat spreader (not shown) may be formed over the upper surface 30U of the second electronic device 30 to enhance heat dissipation ability.

Figure 13:
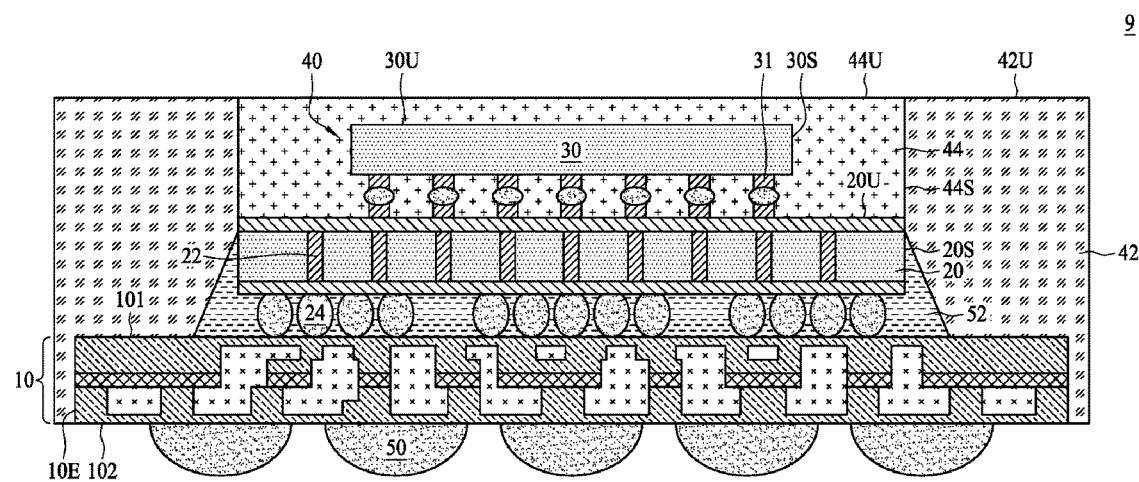
FIG. 13 is a cross-sectional view of a semiconductor device package in accordance with some embodiments of the present disclosure.

FIG. 13 is a cross-sectional view of a semiconductor device package 9 in accordance with some embodiments of the present disclosure. As shown in FIG. 13, differently than is the case for some embodiments of the semiconductor device package 6, the second underfill layer 54 is omitted. The second molding layer 44 of the semiconductor device package 9 is further located between the first electronic device 20 and the second electronic device 30, and configured as a molding underfill (MUF). In some embodiments, the second molding layer 44 may expose the upper surface 30U of the second electronic device 30. In some embodiments, a heat spreader (not shown) may be formed over the upper surface 30U of the second electronic device 30 to enhance heat dissipation ability.

Figure 14:
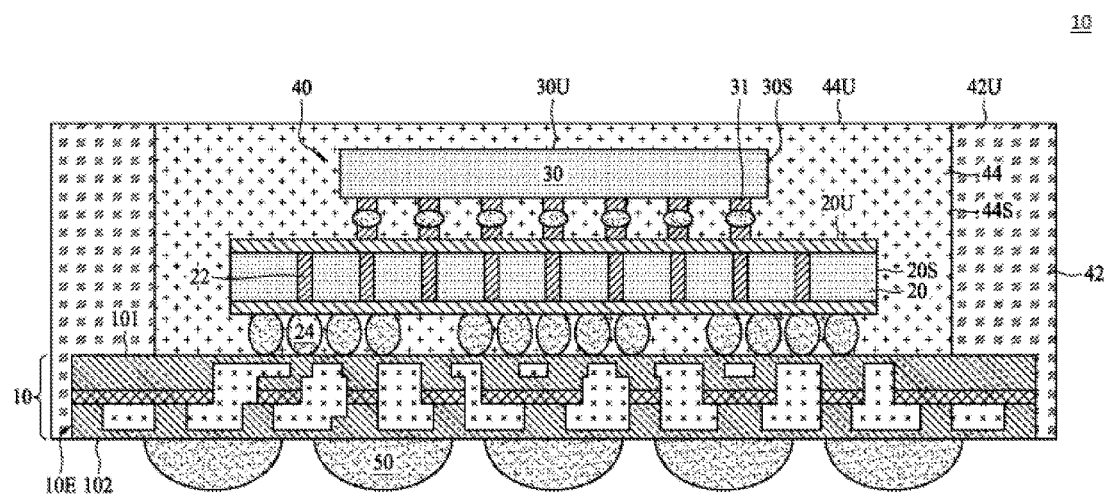
FIG. 14 is a cross-sectional view of a semiconductor device package in accordance with some embodiments of the present disclosure.

FIG. 14 is a cross-sectional view of a semiconductor device package 10 in accordance with some embodiments of the present disclosure. As shown in FIG. 14, differently than is the case for some embodiments of the semiconductor device package 6, the first underfill layer 52 and the second underfill layer 54 are omitted. The second molding layer 44 of the semiconductor device package 10 is further located between the package substrate 10 and the first electronic device 20 and between the first electronic device 20 and the second electronic device 30, and configured as molding underfill (MUF). In some embodiments, the second molding layer 44 may expose the upper surface 30U of the second electronic device 30. In some embodiments, a heat spreader (not shown) may be formed over the upper surface 30U of the second electronic device 30 to enhance heat dissipation ability.

A semiconductor device package of various embodiments of the present disclosure is compatible with WLCSP. An edge of a package substrate configured to receive electronic devices (e.g. have electronic devices disposed on) is encapsulated and protected by a molding layer, and thus robustness of the semiconductor device package is enhanced to prevent the semiconductor device package from being damaged. The thickness of the molding layer and that of the package substrate are configured to alleviate the warpage of the semiconductor device package. The physical characteristics such as CTE, Young's modulus and/or transition temperature of the molding layer(s) are configured to alleviate the warpage of the semiconductor device package.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device package, comprising: a package substrate comprising a first surface, a second surface opposite to the first surface, and an edge; a first electronic device positioned over and electrically connected to the package substrate through the first surface; a second electronic device positioned over and electrically connected to the first electronic device; and a first molding layer positioned over the package substrate, wherein the first molding layer: encapsulates a portion of the first surface of the package substrate; and comprises a portion extending from the first surface of the package substrate to the second surface of the package substrate and covering the edge of the package substrate, wherein a thickness of the portion of the first molding layer measured in a direction parallel to the edge of the package substrate is substantially equal to a total thickness of the package substrate measured in the direction, and the first molding layer is further located between the first electronic device and the second electronic device.

2. The semiconductor device package of claim 1, wherein the first electronic device comprises a plurality of through vias, and the second electronic device is electrically connected to the package substrate through the plurality of through vias of the first electronic device.

3. The semiconductor device package of claim 1, further comprising:
a plurality of first conductive structures positioned between and electrically connected to the package substrate and the first electronic device; and
a plurality of second conductive structures positioned between and electrically connected to the first electronic device and the second electronic device.

4. The semiconductor device package of claim 1, wherein the first molding layer further encapsulates a portion of the first electronic device, and a portion of the second electronic device.

5. The semiconductor device package of claim 1, further comprising a first underfill layer positioned between the package substrate and the first electronic device.

6. The semiconductor device package of claim 1, further comprising a second underfill layer positioned between the first electronic device and the second electronic device.

7. The semiconductor device package of claim 1, wherein the first molding layer is further located between the package substrate and the first electronic device.

8. The semiconductor device package of claim 1, further comprising a second molding layer comprising a sidewall, positioned over the first electronic device, wherein the second molding layer encapsulates a portion of the first electronic device and a portion of the second electronic device, and the sidewall of the second molding layer is surrounded by the first molding layer.

9. The semiconductor device package of claim 1, further comprising a plurality of conductors positioned over and electrically connected to the second surface of the package substrate.

10. The semiconductor device package of claim 1, wherein the first molding layer exposes an upper surface of the second electronic device, and the semiconductor device package further comprises a heat spreader positioned over the upper surface of the second electronic device.

11. A semiconductor device package, comprising: a package substrate comprising a first surface, a second surface opposite to the first surface, and an edge; a first electronic device positioned over and electrically connected to the package substrate through the first surface; a second electronic device positioned over and electrically connected to the first electronic device; and a first molding layer positioned over the package substrate, wherein the first molding layer: encapsulates a portion of the first surface of the package substrate; and comprises a portion extending from the first surface of the package substrate to the second surface of the package substrate and covering the edge of the package substrate, wherein a thickness of the portion of the first molding layer measured in a direction parallel to the edge of the package substrate is substantially equal to a total thickness of the package substrate measured in the direction parallel to the edge of the package substrate; and wherein a warpage of the semiconductor device package is less than 8 mils.

12. The semiconductor device package of claim 11, wherein the first molding layer has a thickness in the direction parallel to the edge of the package substrate measured from the first surface of the package substrate to an upper surface of the first molding layer, and a ratio of the thickness of the first molding layer to the thickness of the package substrate is less than or equal to 0.7.

13. The semiconductor device package of claim 11, wherein a coefficient of thermal expansion (CTE) of the first molding layer is in a range from 5 to 50 ppm/° C.

14. The semiconductor device package of claim 11, further comprising a second molding layer comprising a sidewall, positioned over the first electronic device, wherein the second molding layer encapsulates a portion of an upper surface of the first electronic device and a portion of an upper surface and a sidewall of the second electronic device, and the sidewall of the second molding layer is surrounded by the first molding layer.

15. The semiconductor device package of claim 14, wherein a coefficient of thermal expansion (CTE) of the second molding layer is in a range from 5 to 50 ppm/° C.

16. A semiconductor device package, comprising: a package substrate comprising a first surface, and a second surface opposite to the first surface; a first electronic device comprising an upper surface and a sidewall, and positioned over and electrically connected to the package substrate through the first surface; a second electronic device comprising a sidewall and positioned over and electrically connected to the first electronic device; a first molding layer positioned over the package substrate, wherein the first molding layer encapsulates a portion of the first surface of the package substrate; and a second molding layer comprising a sidewall, positioned over the first electronic device, wherein the second molding layer encapsulates a portion of the upper surface of the first electronic device and the sidewall of the second electronic device, wherein the sidewall of the second molding layer is surrounded by, and in contact with, the first molding layer, and the sidewall of the first electronic device is exposed from the second molding layer.

17. The semiconductor device package of claim 16, wherein the second electronic device comprises an upper surface and the second molding layer further encapsulates the upper surface of the second electronic device.

18. The semiconductor device package of claim 16, wherein the second electronic device comprises an upper surface, and the semiconductor device package further comprises a heat spreader positioned over the upper surface of the second electronic device.

19. The semiconductor device package of claim 16, wherein the first molding layer comprises an upper surface, the second molding layer comprises an upper surface, and the upper surface of the second molding layer is substantially coplanar with the upper surface of the first molding layer.

* * * * *